(12) United States Patent
Liu

(10) Patent No.: US 9,923,535 B2
(45) Date of Patent: Mar. 20, 2018

(54) NOISE CONTROL METHOD AND DEVICE

(71) Applicant: Beijing Zhigu Rui Tuo Tech Co., Ltd, Beijing (CN)

(72) Inventor: Jia Liu, Beijing (CN)

(73) Assignee: BEIJING ZHIGU RUI TUO TECH CO., LTD, Beijing (CN)

( * ) Notice: Subject to any disclaimer, the term of this patent is extended or adjusted under 35 U.S.C. 154(b) by 0 days.

(21) Appl. No.: 15/117,182

(22) PCT Filed: Dec. 29, 2014

(86) PCT No.: PCT/CN2014/095319
§ 371 (c)(1),
(2) Date: Aug. 5, 2016

(87) PCT Pub. No.: WO2015/135365
PCT Pub. Date: Sep. 17, 2015

(65) Prior Publication Data
US 2016/0373080 A1 Dec. 22, 2016

(30) Foreign Application Priority Data

Mar. 10, 2014 (CN) .......................... 2014 1 0085419

(51) Int. Cl.
*H03G 3/32* (2006.01)
*H04R 29/00* (2006.01)
(Continued)

(52) U.S. Cl.
CPC ........... *H03G 3/32* (2013.01); *G10L 21/0232* (2013.01); *H04R 3/04* (2013.01); *H04R 29/001* (2013.01); *G10K 11/16* (2013.01)

(58) Field of Classification Search
None
See application file for complete search history.

(56) References Cited

U.S. PATENT DOCUMENTS 5,666,426 A * 9/1997 Helms .................. H03G 3/32
381/104
7,149,512 B2 12/2006 Connor
(Continued)

FOREIGN PATENT DOCUMENTS

CN 1747320 A 3/2006
CN 1897054 A 1/2007
(Continued)

OTHER PUBLICATIONS

International Search Report for PCT Application No. PCT/CN2014/095282, dated Apr. 3, 2015, 3 pages.
(Continued)

Primary Examiner — Joshua Kaufman
Assistant Examiner — Kenny Truong
(74) Attorney, Agent, or Firm — Amin, Turocy & Watson, LLP

(57) ABSTRACT

A noise control method and device are provided that relate to the field of noise control. The noise control method includes: acquiring noise information of an ambient environment; judging whether the noise information satisfies a predetermined condition, and if yes, acquiring a first message from a first device; and judging, according to the first message, whether the noise information is related to the first device, and if yes, sending a second message to the first device, the second message being used to notify the first device to adjust a volume. The noise control method and device in the embodiments of the present application may easily and quickly realize noise control over a specific device, thereby improving user experience.

54 Claims, 18 Drawing Sheets

(51) Int. Cl.
*H04R 3/04* (2006.01)
*G10L 21/0232* (2013.01)
*G10K 11/16* (2006.01)

(56) References Cited

U.S. PATENT DOCUMENTS

| | | | |
|---|---|---|---|
| 8,422,952 B2 | 4/2013 | Sato et al. | |
| 2003/0123680 A1 | 7/2003 | Lee et al. | |
| 2005/0282590 A1* | 12/2005 | Haparnas | H04M 19/044 455/570 |
| 2007/0165834 A1* | 7/2007 | Redman | H04M 1/6041 379/395 |
| 2008/0085007 A1 | 4/2008 | Engelbrecht et al. | |
| 2010/0048131 A1 | 2/2010 | Hirsch et al. | |
| 2011/0051016 A1 | 3/2011 | Malode | |
| 2011/0211712 A1* | 9/2011 | Yamada | H03G 3/002 381/109 |
| 2012/0039489 A1 | 2/2012 | Chen et al. | |
| 2014/0321680 A1* | 10/2014 | Takahashi | H04S 7/304 381/303 |

FOREIGN PATENT DOCUMENTS

| | | |
|---|---|---|
| CN | 101001274 A | 7/2007 |
| CN | 101079938 A | 11/2007 |
| CN | 101114818 A | 1/2008 |
| CN | 101562671 A | 10/2009 |
| CN | 102118665 A | 7/2011 |
| CN | 102158606 A | 8/2011 |
| CN | 102638602 A | 8/2012 |
| CN | 202383998 U | 8/2012 |
| CN | 102710838 A | 10/2012 |
| CN | 102761721 A | 10/2012 |
| CN | 102883121 A | 1/2013 |
| CN | 102915753 A | 2/2013 |
| CN | 103024630 A | 4/2013 |
| CN | 103138883 A | 6/2013 |
| CN | 103220600 A | 7/2013 |
| CN | 103383447 A | 11/2013 |
| CN | 103595849 A | 2/2014 |
| CN | 103634168 A | 3/2014 |
| CN | 103886731 A | 6/2014 |
| CN | 103886857 A | 6/2014 |
| CN | 103903606 A | 7/2014 |
| DE | 3220758 A1 | 12/1983 |
| JP | H04195000 A | 7/1992 |
| JP | H05211450 A | 8/1993 |
| JP | 2005295272 A | 10/2005 |
| JP | 2006270601 A | 10/2006 |
| JP | 2007142815 A | 6/2007 |
| JP | 2012039492 A | 2/2012 |
| WO | 241489 A3 | 12/2002 |

OTHER PUBLICATIONS

International Search Report for PCT Application No. PCT/CN2014/095276, dated Apr. 3, 2015, 3 pages.
International Search Report for PCT Application No. PCT/CN2014/095319, dated Mar. 27, 2015, 3 pages.
Office Action for U.S. Appl. No. 15/117,166 dated Jun. 29, 2017, 52 pages.
Office Action for U.S. Appl. No. 15/117,172 dated Jul. 19, 2017, 29 pages.
Office Action for U.S. Appl. No. 15/117,172 dated Dec. 28, 2017, 36 pages.

* cited by examiner

NOISE CONTROL METHOD AND DEVICE

RELATED APPLICATION

The present application is a U.S. National Stage filing under 35 U.S.C. § 371 of international patent cooperation treaty (PCT) application No. PCT/CN2014/095319, filed Dec. 29, 2014, and entitled "NOISE CONTROL METHOD AND DEVICE", which claims the benefit of priority to Chinese Patent Application No. 201410085419.1, filed on Mar. 10, 2014, which applications are hereby incorporated into the present application by reference herein in their respective entireties.

TECHNICAL FIELD

The present application relates to the field of noise control technologies, and in particular, to a noise control method and device.

BACKGROUND

Noise pollution is a problem that people often encounter in everyday life. Generally, sounds that affect people's work, study and rest are called noise.

More and more electronic devices, while enriching people's everyday life, also bring about new noise pollution problems. For example, when a user is having a rest in the bedroom, perhaps other family members are watching TV in the living room, and at this time, if a sound that the TV set makes is too loud, the sound easily becomes noise, affecting the user's rest. For another example, when a user is listening to music through an audio system, at this time, the phone rings, and the user answers the phone and finds that the sound of the audio system is too loud, affecting the user's normal answering of the phone.

In the foregoing scenarios, the user often manually controls the volume key of the TV set or the audio system to adjust a volume, and then noise interference may be avoided, which has cumbersome steps and poor user experience.

SUMMARY

An example object of the present application is to provide a noise control method and device.

In a first example aspect, an embodiment of the present application provides a noise control method, and the method includes:

acquiring noise information of an ambient environment;

judging whether the noise information satisfies a predetermined condition, and if yes, acquiring a first message from a first device; and judging, according to the first message, whether the noise information is related to the first device, and if yes, sending a second message to the first device, the second message being used to notify the first device to adjust a volume.

In a second example aspect, an embodiment of the present application provides a noise control method, and the method includes:

acquiring, by a device, sound sampling information of a sound the device makes;

sending a first message including the sound sampling information;

receiving a second message from the external; and adjusting a volume based on a volume adjustment policy according to the second message and a current volume.

In a third example aspect, an embodiment of the present application provides a noise controlling device, and the controlling device includes:

a first acquisition module, configured to acquire noise information of an ambient environment;

a first judgment module, configured to judge whether the noise information satisfies a predetermined condition;

a second acquisition module, configured to acquire a first message from a first device if the noise information satisfies the predetermined condition;

a second judgment module, configured to judge, according to the first message, whether the noise information is related to the first device; and a message sending module, configured to send a second message to the first device if the noise information is related to the first device, the second message being used to notify the first device to adjust a volume.

In a fourth example aspect, an embodiment of the present application provides a noise controlled device, and the controlled device includes:

an acquisition module, configured to acquire sound sampling information of a sound the device makes;

a sending module, configured to send a first message including the sound sampling information;

a receiving module, configured to receive a second message from the external; and an adjustment module, configured to adjust a volume based on a volume adjustment policy according to the second message and a current volume.

Noise control methods and devices in the various embodiments of the present application may easily and quickly realize noise control over a specific device, thereby improving user experience.

DETAILED DESCRIPTION

Various embodiments of the present application are further described in detail hereinafter with reference to the accompanying drawings and embodiments. The following embodiments are intended to describe the present application, but not to limit the scope of the present application.

Those skilled in the art should understand that, in the embodiments of the present application, sequence numbers of steps do not mean an order of execution, and the order of execution of the steps should be determined according to functions and internal logic thereof, but should not pose any limitation to the implementation process of the implementations of the present application.

In addition, the terms such as "first" and "second" in the embodiments of the present application are merely used to distinguish different steps, devices or modules, which neither represent any specific technical meaning nor represent a necessary logical order between them.

The term "noise" in the present application refers to sounds that affect people's work, study and rest, which has relativity, for example, when a user makes a call, voices, music, whistles and the like around the user may become noise.

During research, the inventor has found that, before a user enters into a sound sensitive state, the user may often perform regular operations on a portable electronic device. For example, before going to bed, the user may adjust the mobile phone to a silent mode. For another example, before answering the phone, the user may press the answer key. Therefore, according to the user's operating habits, the corresponding electronic device (for example, a mobile phone) may previously know that the user will enter into a sound sensitive state, so as to notify surrounding electronic devices which are making a sound to reduce the volume in advance, thereby avoiding interference with the user.

Figure 1:
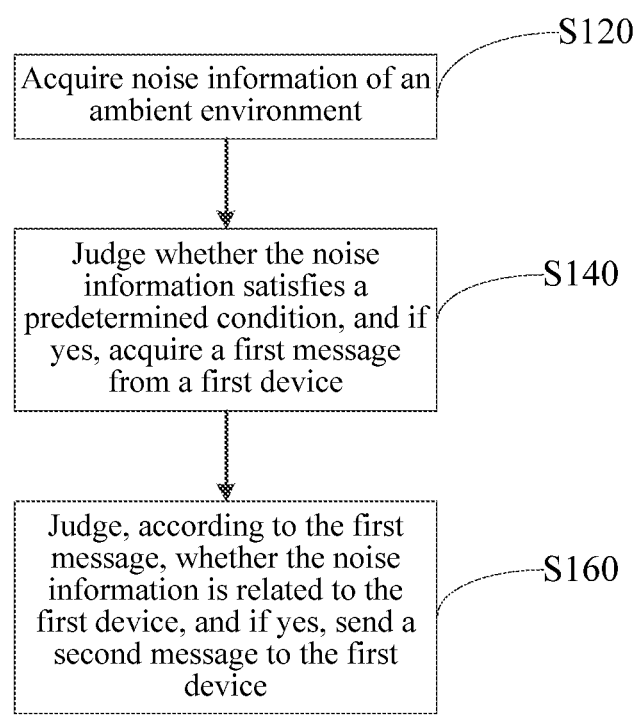
FIG. 1 is an example flowchart of a noise control method according to an embodiment of the present application.

FIG. 1 is a flowchart of a noise control method according to an embodiment of the present application; the method may be executed by, for example, a noise controlling device, as shown in FIG. 1, and the method includes:

S120: acquiring noise information of an ambient environment;

S140: judging whether the noise information satisfies a predetermined condition, and if yes, acquiring a first message from a first device; and S160: judging, according to the first message, whether the noise information is related to the first device, and if yes, sending a second message to the first device, the second message being used to notify the first device to adjust a volume.

According to the noise control method in the embodiment of the present application, noise information is acquired from noise in an ambient environment, a first message is acquired from a first device, and in the case that the noise information is related to the first device, a second message is automatically sent to the first device, so as to notify the first device to adjust a volume, thereby easily and quickly realizing noise control over a specific device, and improving user experience.

Functions of the steps S120, S140 and S160 are described below in detail.

In an example implementation, in the step S120, the noise information includes: a noise intensity value. The noise intensity value refers to information that may reflect intensity of noise in an ambient environment, for example, it may be a noise sound pressure level, a noise signal intensity or the like.

In an example implementation, in the step S140, the satisfying a predetermined condition includes that: the noise intensity value is greater than a predetermined threshold. The predetermined threshold may be set by a user, for example, a setting interface is output, and set the predetermined threshold according to an input value of the user. Alternatively, the predetermined threshold may be automatically set according to the user's current sensitivity to noise, for example, when the user adjusts a mobile phone to a silent mode, it indicates that the user may want to sleep next, and the predetermined threshold is automatically set to 10 dB;

when the user presses an answer key of a mobile phone, the predetermined threshold is automatically set to 20 dB.

The first device may be one or more devices that may produce noise, for example, TV sets, audio systems, person computers or other devices. In the step S140, the first message may be acquired from the first device through passive receiving, for example, the first device broadcasts the first message, and the first message is directly received according to the method; or the first message may also be acquired from the first device through active requesting, for example, according to the method, a request message is first sent to the first device, and the first device feeds back the first message according to the request message.

The first message may include sound sampling information of the first device. The sound sampling information may be a sound sampling fragment of the first device, and may also be a sound sampling feature of the first device.

In the step S160, the judging, according to the first message, whether the noise information is related to the first device may include:

S161: judging whether the sound sampling information matches the noise information, and if yes, judging that the noise information is related to the first device.

For the sake of simplicity, the following description about the step S161 is merely based on the situation where the sound sampling information is a sound sampling fragment (when the noise sampling information is a sound sampling feature, the following steps a and b may be omitted during processing on the sound sampling information).

In an example implementation, the step S161 may include:

a) dividing an audio signal to be processed into a plurality of frames;

b) extracting features of audio signals of each frame, the features include, but are not limited to, Fourier coefficients, Mel-frequency Cepstral Coefficients (MFCCs), spectral flatness, spectral sharpness, Linear Predictive Coding coefficients and the like;

c) compressing the extracted features by using a classification algorithm, to form a sub-fingerprint corresponding to each frame;

d) taking the sound sampling information as the audio signal to be processed to execute the steps a-c, to obtain a plurality of sub-fingerprints corresponding to the sound sampling information, the plurality of sub-fingerprints forming a fingerprint block; and taking the noise information as the audio signal to be processed to execute the steps a-c, to obtain a plurality of sub-fingerprints corresponding to the noise information, the plurality of sub-fingerprints forming a fingerprint stream; and e) comparing similarity between different parts of the fingerprint block and the fingerprint stream, so as to judge whether they match each other; when the similarity is greater than a predetermined value, it may be considered that they match each other.

Reference may be made to Jaap Haitsma and Antonius Kalker et al.'s Paper "A Highly Robust Audio Fingerprinting System", International Symposium on Music Information Retrieval (ISMIR) 2002, pp. 107-115, for example implementation of the steps a-e. This is not the focus of the present application, and is not repeated herein.

In the example implementation, the noise information may be noise information in a predetermined time period, and in order to improve matching accuracy, the length of the predetermined time period should be greater than a time length threshold, for example, the noise information may be a noise record with a time length of 1 minute.

In an example implementation, the first device that receives the second message may reduce its volume upon receipt of the second message, for example, the device reduces the volume by 10 dB each time.

In an example implementation, the first device may also make out its volume adjustment policy flexibly according to actual situations. In this case, corresponding information may be transmitted to the first device through the second message, so as to provide a basis for the first device to make out a volume adjustment policy.

In an example implementation, the second message may include: the noise intensity value, the predetermined threshold, and a transmit power value of the second message.

In an example implementation, the second message may include: the noise intensity value, the predetermined threshold, and position information of a sender of the second message.

In an example implementation, the second message may include: the noise intensity value, the predetermined threshold, noise sampling information and a corresponding sampling time. The noise sampling information and the sampling time may be acquired during acquisition of the noise information, that is to say, the noise information acquired from the noise of the ambient environment includes the noise sampling information and the sampling time. The noise sampling information may be an original noise sampling fragment or a processed noise sampling feature.

How the first device uses information included in the second message to adjust the volume will be described hereinafter, which is not repeated herein.

The noise information in the present application may be noise information corresponding to all collected sound frequencies. In addition, in another example implementation, the noise information may also be noise information of some specific sound frequency intervals, that is, noise information of at least one sound frequency interval. The implementation is mainly applicable to a situation where the user is relatively sensitive to noise in a specific sound frequency interval, for example, when the user is thinking, in terms of voices of character dialogues from a TV set and music from an audio system, the user may be more sensitive to the voices of dialogues. Therefore, the mobile phone of the user may acquire noise information of a sound frequency interval (for example, 300 HZ to 3400 HZ) corresponding to the voices of character dialogues from the noise of the ambient environment according to the user's habits, and then tasks in the steps S140 and S160 are executed.

Suppose that the noise information is noise information within a sound frequency interval corresponding to the voices of character dialogues and the corresponding first message is acquired respectively from the TV set and the audio system in the method, in the step S160, it may be judged that the noise information is related to the TV set, instead of being related to the audio system, so that a second message may be sent to the TV set according to the method, so as to notify the TV set to reduce the volume. Therefore, the method in the implementation may control a specific electronic device to reduce noise more pertinently.

Figure 2:
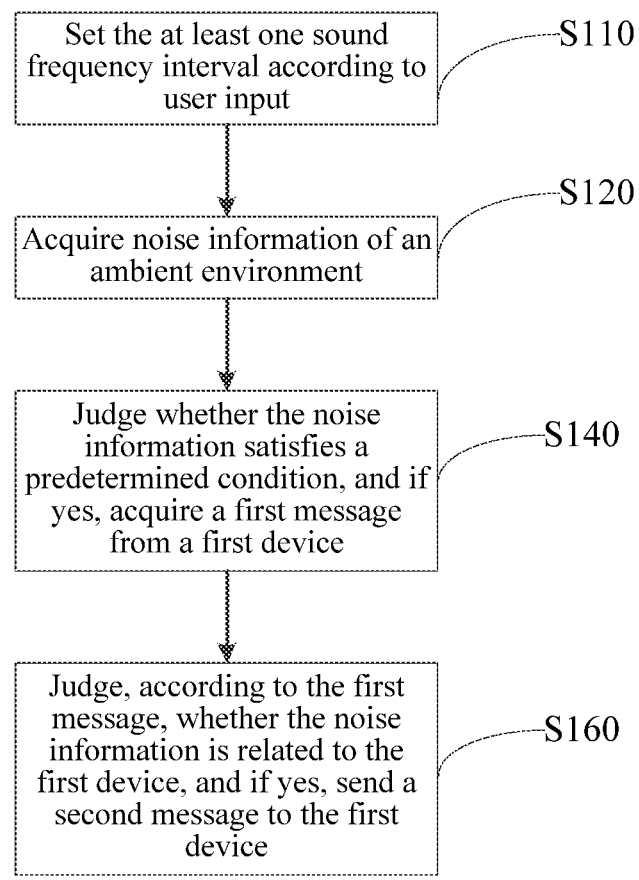
FIG. 2 is an example flowchart of a noise control method in an implementation of an embodiment of the present application.

In addition, in another example implementation, the sound frequency interval may be set by the user; as shown in FIG. 2, the method may further include:

S110: setting at least one sound frequency interval according to user input.

In addition, the embodiments of the present application also provide a computer readable medium, comprising computer readable instructions which perform the following operations when being executed: executing the operations of steps S120, S140 and S160 of the method in the implementation shown in FIG. 1.

To sum up, according to the noise control method in the example implementation, judgment may be made according to noise information of an ambient environment, if adjustment is satisfied, the second message is sent to other devices, and corresponding information may be transmitted through the second message, so that the other devices make out a volume adjustment policy according to their own situations, thereby simplifying noise control steps and improving user experience.

Figure 3:
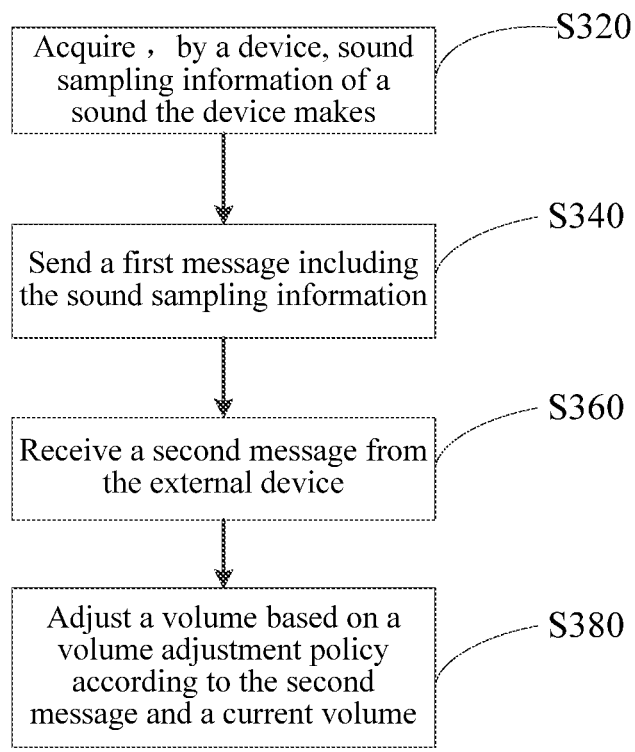
FIG. 3 is an example flowchart of a noise control method according to an embodiment of the present application.

FIG. 3 is a flowchart of a noise control method according to another embodiment of the present application; the method may be executed by, for example, a noise controlled device, as shown in FIG. 3, and the method includes:

S320: acquiring, by the device, sound sampling information of a sound the device makes;

S340: sending a first message including the sound sampling information;

S360: receiving a second message from an external device; and

S380: adjusting a volume based on a volume adjustment policy according to the second message and a current volume.

According to the method in this embodiment, sound sampling information of a sound the device makes is acquired, a first message including the sound sampling information is sent, a second message sent from an external device is received, and a volume is adjusted based on a volume adjustment policy according to the second message and a current volume, so that the noise controlled device may take the initiative to report its own sounding condition to the external device and automatically adjust the volume according to a request from the external device, thereby reducing noise output, simplifying noise control steps, and improving user experience.

Functions of the steps S320, S340, S360 and S380 are described below in detail.

In the step S320, the sound sampling information may be collected through a microphone at a sound output side, and may also be acquired by intercepting corresponding audio signals before sound output. The sound sampling information may include: a sound sampling fragment or a sound sampling feature. The sound sampling fragment may be a non-processed sound recording or audio signal data, and the sound sampling feature may be feature information extracted from the sound sampling fragment, such as a spectral feature.

In the step S340, the first message including the sound sampling information may be sent through broadcasting, and the first message including the sound sampling information may also be sent to a specific device through unicasting. In the case of unicasting, a sender of the first message should know in advance labeling information of the specific device, for example, a TV set of the user is notified in advance about a MAC address of the user's mobile phone, and the TV set may send the first message to the mobile phone through unicasting.

In the step S360, the external device is an electronic device that receives the first message, for example, the TV set in the foregoing example.

Figure 4:
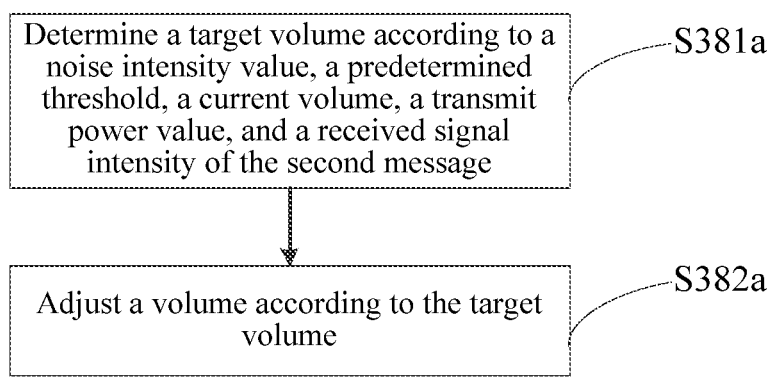
FIG. 4 is an example flowchart of step S380 in an implementation of an embodiment of the present application.

In an example implementation, the second message includes: a noise intensity value, a predetermined threshold, and a transmit power value of the second message. Moreover, referring to FIG. 4, the step S380 includes:

S381a: determining a target volume according to the noise intensity value, the predetermined threshold, the current volume, the transmit power value, and a received signal intensity of the second message; and S382a: adjusting the volume according to the target volume.

The target volume in the present application is a target value after volume adjustment. In the step S382a, the volume may be directly adjusted to the target volume.

Figure 5:
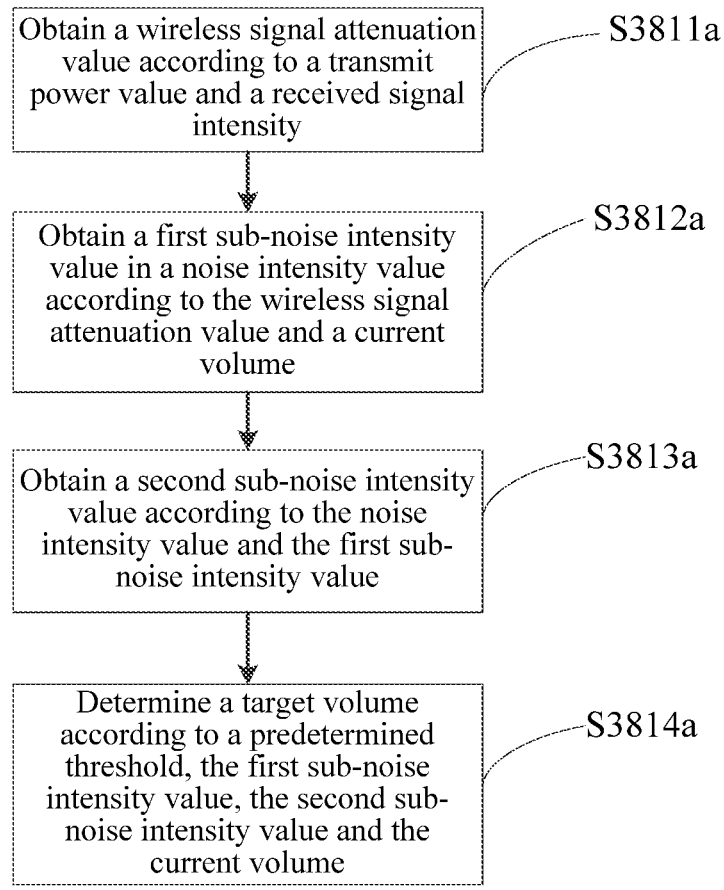
FIG. 5 is an example flowchart of step S381a in an implementation of an embodiment of the present application.

Specifically, in an example implementation, referring to FIG. 5, the step S381a may include:

S3811a: obtaining a wireless signal attenuation value according to the transmit power value and the received signal intensity;

S3812a: obtaining a first sub-noise intensity value in the noise intensity value according to the wireless signal attenuation value and the current volume;

S3813a: obtaining a second sub-noise intensity value according to the noise intensity value and the first sub-noise intensity value; and S3814a: determining the target volume according to the predetermined threshold, the first sub-noise intensity value, the second sub-noise intensity value and the current volume.

In an example implementation, the step S3812a may include:

S38121a: determining an intermediate parameter according to the wireless signal attenuation value, where the intermediate parameter may be a parameter capable of associating the wireless signal attenuation value and a sound signal attenuation value, for example, it may be a distance; and S38122a: obtaining the first sub-noise intensity value in the noise intensity value according to the intermediate parameter and the current volume.

In the present application, the noise intensity value may include: a noise sound pressure level or a noise signal intensity, which reflects information of intensity of noise at the external device. The first sub-noise intensity value reflects a contribution value of a sound output by a current noise source (that is, a current sounding device) for intensity of noise at the external device; the second sub-noise intensity value reflects a contribution value of a sound output by another noise source (that is, another sounding device) for the intensity of the noise at the external device. Correspondingly, when the noise intensity value is the noise sound pressure level, the first sub-noise intensity value is a first sub-noise sound pressure level, and the second sub-noise intensity value is a second sub-noise sound pressure level; when the noise intensity value is the noise signal intensity, the first sub-noise intensity value is a first sub-noise signal intensity, and the second sub-noise intensity value is a second sub-noise signal intensity. For the sake of simplicity, the following description is given merely by illustrating the situation where the noise intensity value is the noise sound pressure level.

Suppose that the transmit power value of the second message is Lt, the received signal intensity of the second message is Lr, the current volume is Lc, the noise sound pressure level at the external device is $Lp_0$, and the predetermined threshold is Lp.

The wireless signal attenuation value $Ld_1$ may be obtained according to the step S3411a:

$Ld_1 = Lt - Lr$.

For the sake of simplicity, it is considered that attenuation of a wireless signal is merely related to a propagation distance of the signal, and suppose that the propagation distance of the signal and an attenuation value of the wireless signal have a first function relationship therebetween, a distance D between the device and the external device may be obtained according to the step S34121a:

$$D=f_1(Ld_1);$$

where $f_1$ denotes the first function relationship.

For the sake of simplicity, it is considered that attenuation of a sound is merely related to a propagation distance of the sound, and suppose that an attenuation value of the sound and the propagation distance thereof have a second function relationship therebetween, an attenuation value $Ld_2$ of the sound after passing through the distance may be obtained according to the step S34122a:

$$Ld_2=f_2(D);$$

where $f_2$ denotes the second function relationship.

Further, according to the current volume, the first sub-noise sound pressure level $Lp_1$ at the external device may be obtained:

$$Lp_1=Lc-Ld_2;$$

in the step S3413a, suppose that the second sub-noise sound pressure level is $Lp_2$, there is a formula according to sound intensity superposition:

$$Lp_0 = 10 \times lg\left(10^{\frac{Lp_1}{10}} + 10^{\frac{Lp_2}{10}}\right);$$

$Lp_2$ may be obtained through calculation according to the formula.

In the step S3414a, first suppose that other noise sources may not adjust the volume and also suppose that the first sub-noise sound pressure level after volume adjustment is $Lp_1'$, according to the predetermined threshold Lp and the second sub-noise sound pressure level $Lp_2$, there is a formula according to sound intensity superposition:

$$Lp = 10 \times lg\left(10^{\frac{Lp_1'}{10}} + 10^{\frac{Lp_2}{10}}\right);$$

$Lp_1'$ may be obtained through calculation according to the formula.

Further, the target volume La may be obtained according to the current volume Lc and the first sub-noise sound pressure levels $Lp_1$ and $Lp_1'$ before and after volume adjustment:

$$La=Lc-(Lp_1-Lp_1').$$

Those skilled in the art should understand that, in the step S3814a, in determination of the target volume, it may also be assumed that the other noise sources may adjust the volume, for example, it may be assumed that the second sub-noise sound pressure level after adjustment of the other noise sources is $Lp_2'=Lp_2\times 50\%$.

Figure 6:
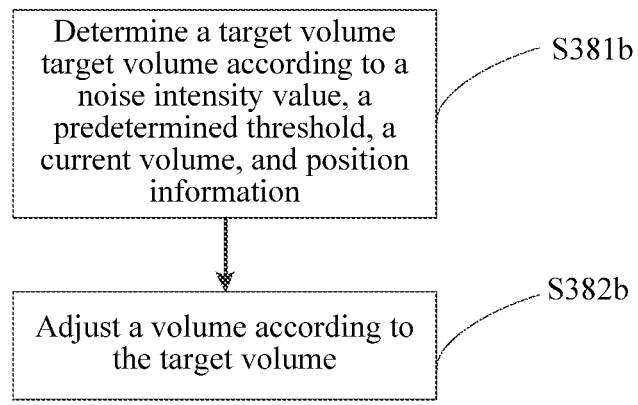
FIG. 6 is an example flowchart of step S380 in an implementation of an embodiment of the present application.

In an example implementation, the second message includes: a noise intensity value, a predetermined threshold, and position information. The position information is position information of the external device. Moreover, referring to FIG. 6, the step S380 includes:

S381b: determining a target volume according to the noise intensity value, the predetermined threshold, the current volume and the position information; and S382b: adjusting the volume according to the target volume.

Figure 7:
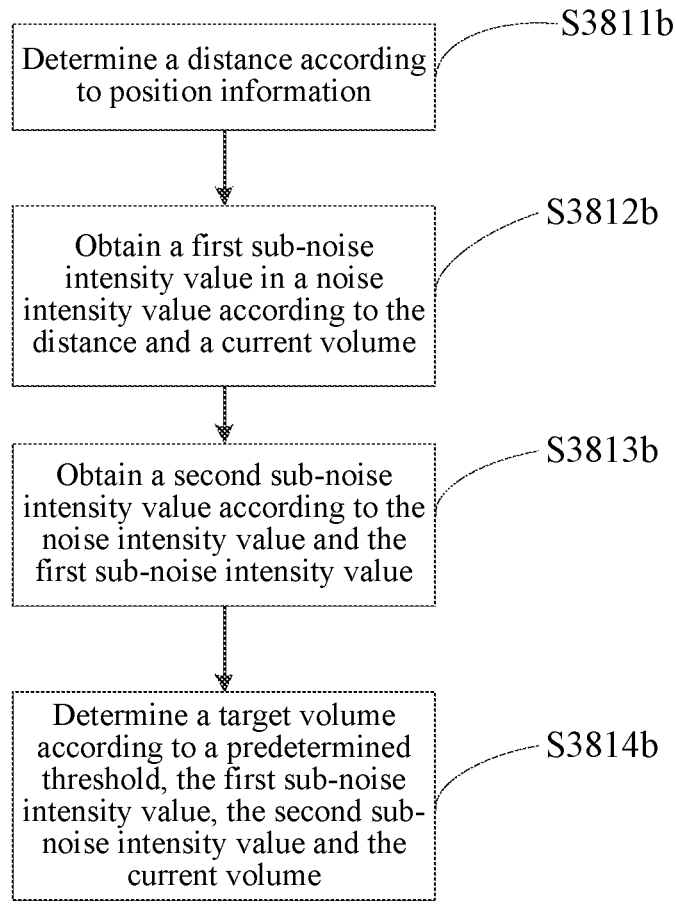
FIG. 7 is an example flowchart of step S381b in an implementation of an embodiment of the present application.

Specifically, referring to FIG. 7, in an example implementation, the step S381b may include:

S3811b: determining a distance according to the position information;

S3812b: obtaining the first sub-noise intensity value in the noise intensity value according to the distance and the current volume;

S3813b: obtaining a second sub-noise intensity value according to the noise intensity value and the first sub-noise intensity value; and S3814b: determining the target volume according to the predetermined threshold, the first sub-noise intensity value, the second sub-noise intensity value and the current volume.

In the step S3811b, the distance is a distance from a current sounding source to the external device. The current sounding source may acquire its own position information through indoor positioning or other technologies, and a distance between it and the external device may be obtained in combination with position information of the external device.

The example implementation process of the steps S3812b-S3814b is similar to that of the steps S3812a, S3813a and S3814a in the previous implementation, which is not repeated herein.

Figure 8:
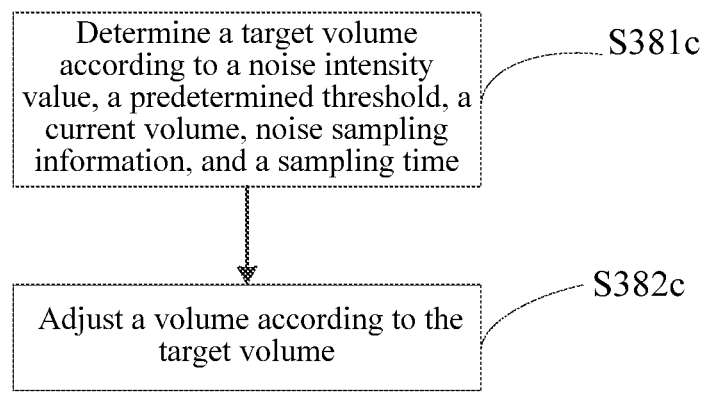
FIG. 8 is an example flowchart of step S380 in an implementation of an embodiment of the present application.

In an example implementation, the second message includes: a noise intensity value, a predetermined threshold, noise sampling information and a corresponding sampling time. Moreover, referring to FIG. 8, the step S380 includes:

S381c: determining a target volume according to the noise intensity value, the predetermined threshold, the current volume, the noise sampling information and the sampling time; and S382c: adjusting the volume according to the target volume.

Figure 9:
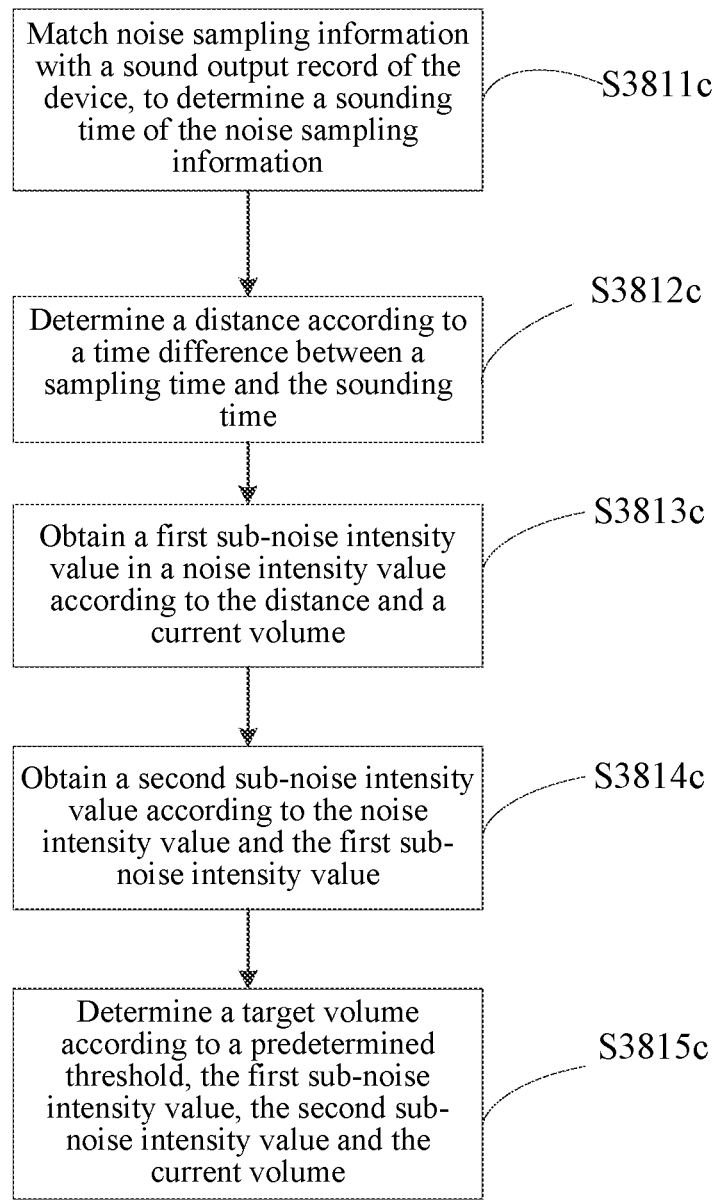
FIG. 9 is an example flowchart of step S381c in an implementation of an embodiment of the present application.

Specifically, in an example implementation, referring to FIG. 9, the step S381c may include:

S3811c: matching the noise sampling information with a sound output record of the device, to determine a sounding time of the noise sampling information;

S3812c: determining a distance according to a time difference between the sampling time and the sounding time;

S3813c: obtaining the first sub-noise intensity value in the noise intensity value according to the distance and the current volume;

S3814c: obtaining a second sub-noise intensity value according to the noise intensity value and the first sub-noise intensity value; and S3815c: determining the target volume according to the predetermined threshold, the first sub-noise intensity value, the second sub-noise intensity value and the current volume.

In the step S3811c, the noise sampling information may be a recording of ambient noise, that is, a noise sampling fragment, and may also be a noise sampling feature (such as a spectral feature) obtained through extraction after processing on the noise sampling fragment. For the sake of simplicity, the following description about the step S3811c is merely based on the situation where the noise sampling information is a noise sampling fragment (when the noise sampling information is a noise sampling feature, the following steps a and b may be omitted during processing on the noise sampling information).

In an example implementation, the step S3811c may include:

a) dividing an audio signal to be processed into a plurality of frames;

b) extracting features of audio signals of each frame, the features include, but are not limited to, Fourier coefficients, Mel-frequency Cepstral Coefficients (MFCCs), spectral flatness, spectral sharpness, Linear Predictive Coding coefficients and the like;

c) compressing the extracted features by using a classification algorithm, to form a sub-fingerprint corresponding to each frame;

d) taking the noise sampling information as the audio signal to be processed to execute the steps a-c, to obtain a plurality of sub-fingerprints corresponding to the noise sampling information, the plurality of sub-fingerprints forming a fingerprint block; and taking sound output of the device as the audio signal to be processed to execute the steps a-c, to obtain a plurality of sub-fingerprints corresponding to the sound output, the plurality of sub-fingerprints forming a fingerprint stream; and e) comparing similarity between different parts of the fingerprint block and the fingerprint stream, so as to judge whether they match each other; when the similarity is greater than a predetermined value, it may be considered that they match each other, and a sounding time of the noise sampling information may be obtained in the case that they match each other.

Reference may be made to Jaap Haitsma and Antonius Kalker et al.'s Paper "A Highly Robust Audio Fingerprinting System", International Symposium on Music Information Retrieval (ISMIR) 2002, pp. 107-115, for example implementation of the steps a-e. This is not the focus of the present application, and is not repeated herein.

In the step S3812$c$, a time difference may be obtained according to the sampling time and the sounding time, and then a distance between the device and the external device may be obtained in combination with a propagation speed of the sound in the air.

The example implementation process of the steps S3813$c$-S3815$c$ is similar to that of the steps S3812$b$-S3814$b$ in the previous example implementation, which is not repeated herein.

Figure 10:
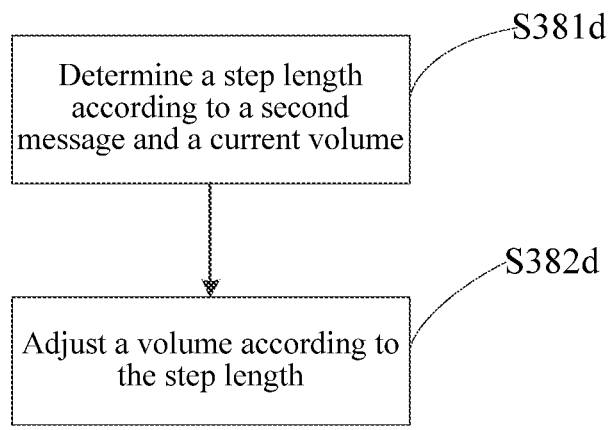
FIG. 10 is an example flowchart of step S380 in an implementation of an embodiment of the present application.

Referring to FIG. 10, in an example implementation, the step S380 includes:

S381$d$: determining a step length according to the second message and the current volume; and S382$d$: adjusting the volume according to the step length.

In order to better realize the method in the example implementation, the method in the implementation may be executed cyclically, that is, each time the second message is received, the step S380 is executed once, until the second message is no longer received. The step length may be a fixed value, and may also be a non-fixed value. The step length may be set with reference to the current volume, for example, when the current volume is great, a large step length is set, and when the current volume is small, a small step length is set.

For example, when the second message is received for the first time, the current volume is 80 dB, the step length is determined to be −20 dB, and the adjusted volume is 60 dB; when the second message is received for the second time, the current volume is 60 dB, the step length is determined to be −8 dB, and the adjusted volume is 52 dB; when the second message is received for the third time, the current volume is 52 dB, the step length is determined to be −5 dB, and the adjusted volume is 47 dB.

Figure 11:
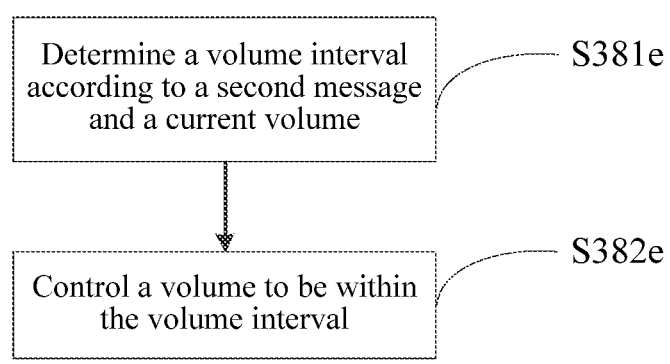
FIG. 11 is an example flowchart of step S380 in an implementation of an embodiment of the present application.

Referring to FIG. 11, in an example implementation, the step S380 includes:

S381$e$: determining a volume interval according to the second message and the current volume; and S382$e$: controlling the volume to be within the volume interval.

In the example implementation, reference may be made to a predetermined proportion of the current volume for determination of the volume interval, for example, an upper limit of the volume interval may be set to 50% of the current volume, a lower limit is set to 0, and suppose that the current volume is 80 dB, the volume interval determined in the step S341$e$ is [40, 0].

According to the method in the example implementation, merely output volume of an audio signal beyond a volume interval may be adjusted, so as to avoid the situation where the output volume of a part with a smaller volume value in the audio signal is 0 after adjustment to result in that other users cannot hear totally.

In addition, the embodiments of the present application also provide a computer readable medium, comprising computer readable instructions which perform the following operations when being executed: executing the operations of steps S320, S340, S360 and S380 of the method in the example implementation shown in FIG. 3.

To sum up, according to the noise control method in this embodiment, sound sampling information of the device may be actively reported to the external device, a second message of the external device is received, target volume, a step length or a volume interval may be determined according to related information in the second message and the current volume of the device, and then corresponding volume adjustment may be performed, so as to easily, quickly and more pertinently realize control over ambient noise, thereby improving user experience.

Figure 12:
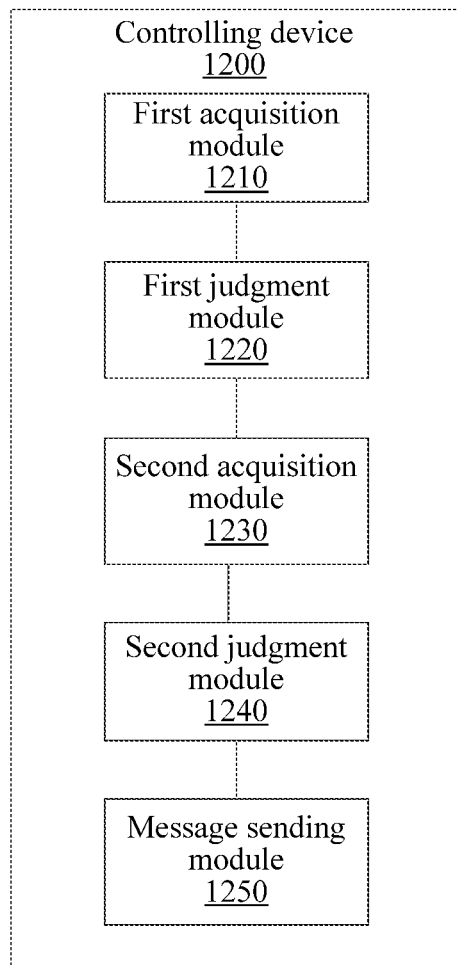
FIG. 12 is an example schematic diagram of a modular structure of a noise controlling device according to an embodiment of the present application.

FIG. 12 is a schematic diagram of a modular structure of a noise controlling device according to an embodiment of the present application. The noise controlling device may generally be a device carried by a user, for example, a smart phone, a smart watch, smart glasses, a smart ring or other devices. The devices are carried by the user, noise information acquired by the devices is closer to noise that the user feels with ears.

As shown in FIG. 12, the controlling device 1200 includes:

a first acquisition module 1210, configured to acquire noise information of an ambient environment;

a first judgment module 1220, configured to judge whether the noise information satisfies a predetermined condition;

a second acquisition module 1230, configured to acquire a first message from a first device if the noise information satisfies the predetermined condition;

a second judgment module 1240, configured to judge, according to the first message, whether the noise information is related to the first device; and a message sending module 1250, configured to send a second message to the first device if the noise information is related to the first device, the second message being used to notify the first device to adjust a volume.

Figure 13:
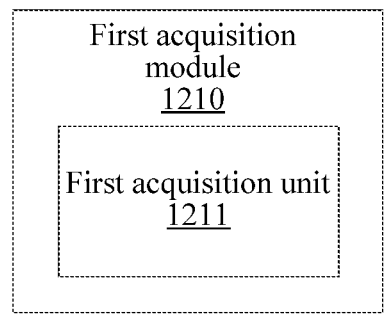
FIG. 13 is an example schematic diagram of a modular structure of a first acquisition module in an implementation of an embodiment of the present application.

In an example implementation, the noise information includes: a noise intensity value. The noise intensity value refers to information that may reflect intensity of noise in an ambient environment, for example, it may be a noise sound pressure level, a noise signal intensity or the like. Referring to FIG. 13, in this example implementation, the first acquisition module 1210 includes:

a first acquisition unit 1211, configured to acquire a noise intensity value of the ambient environment.

In an example implementation, the satisfying a predetermined condition includes that: the noise intensity value is greater than a predetermined threshold.

In an example implementation, the second message may include: the noise intensity value, the predetermined threshold, and a transmit power value of the second message.

In an example implementation, the second message may include: the noise intensity value, the predetermined threshold, and position information of a sender of the second message.

Figure 14:
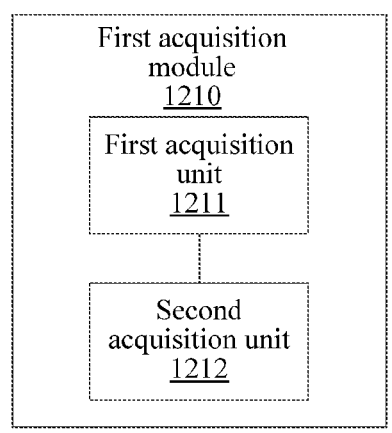
FIG. 14 is an example schematic diagram of a modular structure of a first acquisition module in an implementation of an embodiment of the present application.

In an example implementation, the second message may include: the noise intensity value, the predetermined threshold, noise sampling information and a corresponding sampling time. The noise sampling information and the sampling time may be acquired during acquisition of the noise information, that is to say, the noise information acquired from the noise of the ambient environment includes the noise sampling information and the sampling time. Referring to FIG. 14, in the example implementation, the first acquisition module 1210 may further include:

a second acquisition unit 1212, configured to acquire noise sampling information and a corresponding sampling time from noise of the ambient environment.

Figure 15:
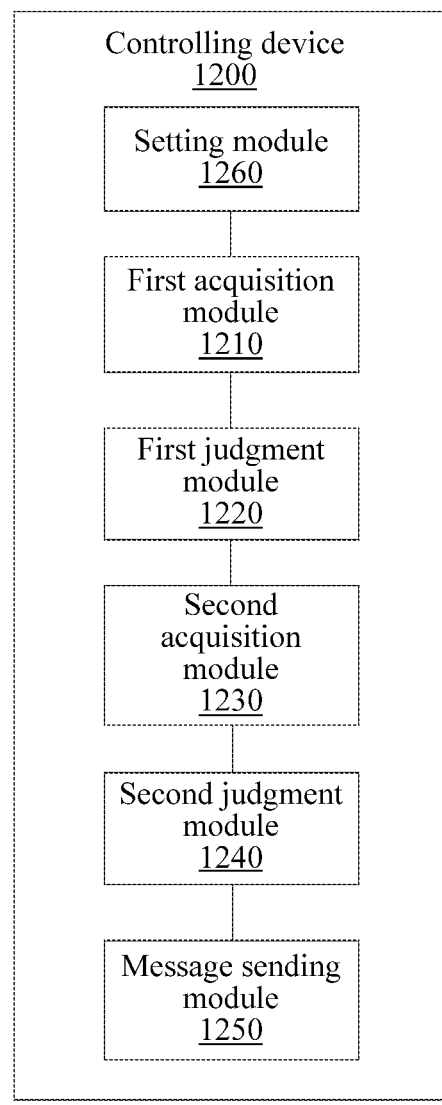
FIG. 15 is an example schematic diagram of a modular structure of a noise controlling device in an implementation of an embodiment of the present application.

The noise information in the present application may be noise information corresponding to all collected sound frequencies. In addition, in another example implementation, the noise information may also be noise information of some specific sound frequency intervals, that is, noise information of at least one sound frequency interval. Referring to FIG. 15, in the example implementation, the controlling device 1200 may further include:

a setting module 1260, configured to set at least one sound frequency interval according to user input, the noise information being noise information of at least one sound frequency interval.

Figure 16:
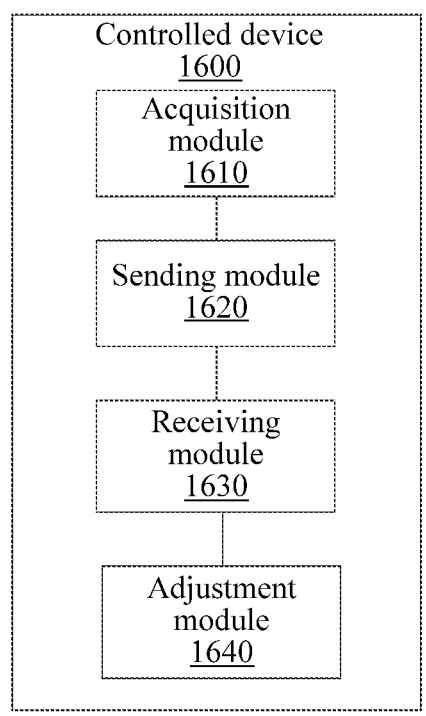
FIG. 16 is an example schematic diagram of a modular structure of a noise controlled device according to an embodiment of the present application.

FIG. 16 is a schematic diagram of a modular structure of a noise controlled device according to an embodiment of the present application; the noise controlled device may be, for example, a TV set, an audio device, a game console, a personal computer, a mobile phone and other devices that may make a loud sound.

Referring to FIG. 16, the controlled device 1600 may include:

an acquisition module 1610, configured to acquire sound sampling information of a sound the device makes;

a sending module 1620, configured to send a first message including the sound sampling information;

a receiving module 1630, configured to receive a second message from an external device; and an adjustment module 1640, configured to adjust a volume based on a volume adjustment policy according to the second message and a current volume.

Figure 17:
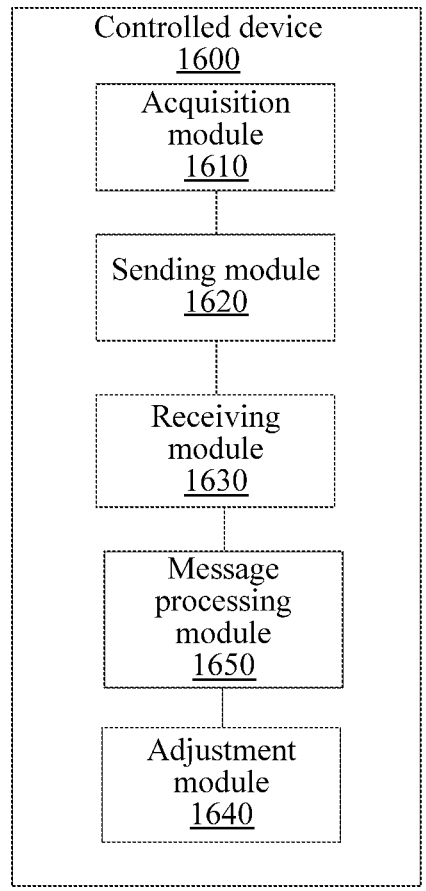
FIG. 17 is an example schematic diagram of a modular structure of a noise controlled device in an implementation of an embodiment of the present application.

Referring to FIG. 17, in an example implementation, the controlled device 1600 further includes:

a message processing module 1650, configured to extract a noise intensity value and a predetermined threshold from the second message.

In an example implementation, the message processing module 1650 is further configured to extract a transmit power value of the second message from the second message.

Figure 18:
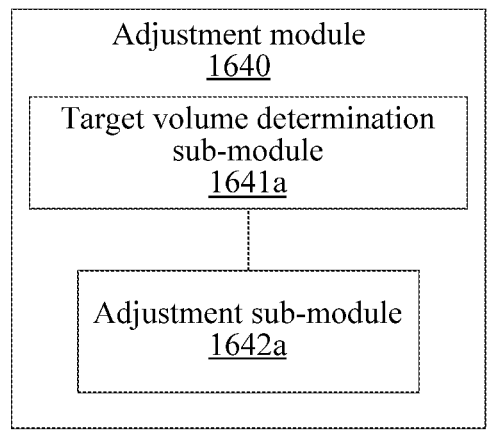
FIG. 18 is an example schematic diagram of a modular structure of an adjustment module in an implementation of an embodiment of the present application.

Referring to FIG. 18, in the example implementation, the adjustment module 1640 may include:

a target volume determination sub-module 1641a, configured to determine a target volume according to the noise intensity value, the predetermined threshold, the current volume, the transmit power value and a received signal intensity of the second message; and an adjustment sub-module 1642a, configured to adjust the volume according to the target volume.

Figure 19:
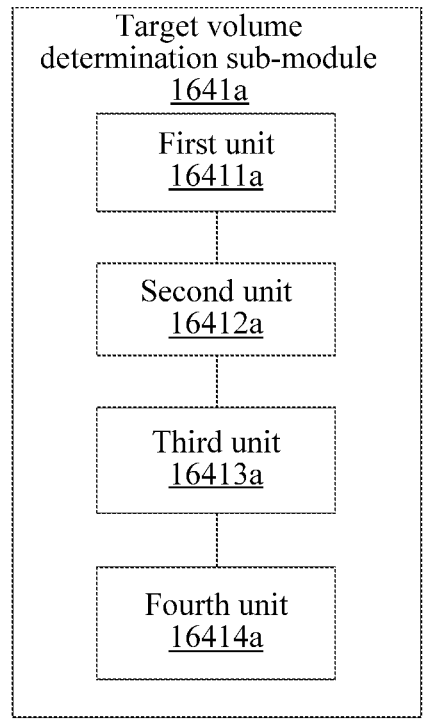
FIG. 19 is an example schematic diagram of a modular structure of a target volume determination sub-module in an implementation of an embodiment of the present application.

Referring to FIG. 19, the target volume determination sub-module 1641a may include:

a first unit 16411a, configured to obtain a wireless signal attenuation value according to the transmit power value and the received signal intensity;

a second unit 16412a, configured to obtain a first sub-noise intensity value in the noise intensity value according to the wireless signal attenuation value and the current volume;

a third unit 16413a, configured to obtain a second sub-noise intensity value according to the noise intensity value and the first sub-noise intensity value; and a fourth unit 16414a, configured to determine the target volume according to the predetermined threshold, the first sub-noise intensity value, the second sub-noise intensity value and the current volume.

Figure 20:
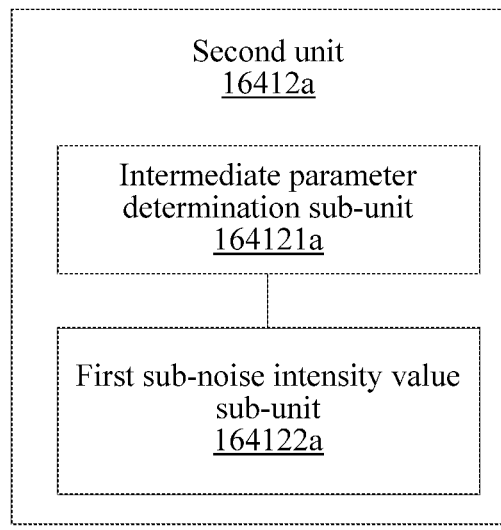
FIG. 20 is an example schematic diagram of a modular structure of a second unit in an implementation of an embodiment of the present application.

Referring to FIG. 20, the second unit 16412a may include:

an intermediate parameter determination sub-unit 164121a, configured to determine an intermediate parameter according to the wireless signal attenuation value; and a first sub-noise intensity value sub-unit 164122a, configured to obtain the first sub-noise intensity value according to the intermediate parameter and the current volume.

In an example implementation, the message processing module 1650 is further configured to extract position information of the external device from the second message.

Figure 21:
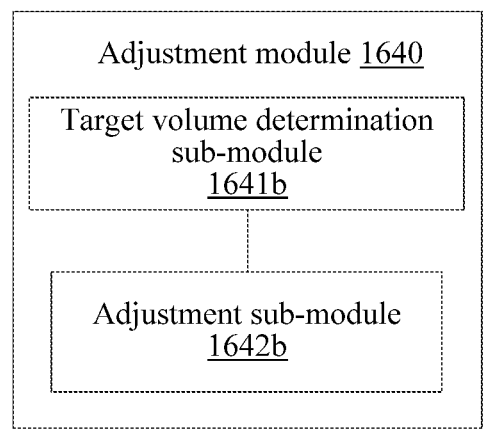
FIG. 21 is an example schematic diagram of a modular structure of an adjustment module in an implementation of an embodiment of the present application.

Referring to FIG. 21, in the example implementation, the adjustment module 1640 may include:

a target volume determination sub-module 1641b, configured to determine a target volume according to the noise intensity value, the predetermined threshold, the current volume and the position information; and an adjustment sub-module 1642b, configured to adjust the volume according to the target volume.

Figure 22:
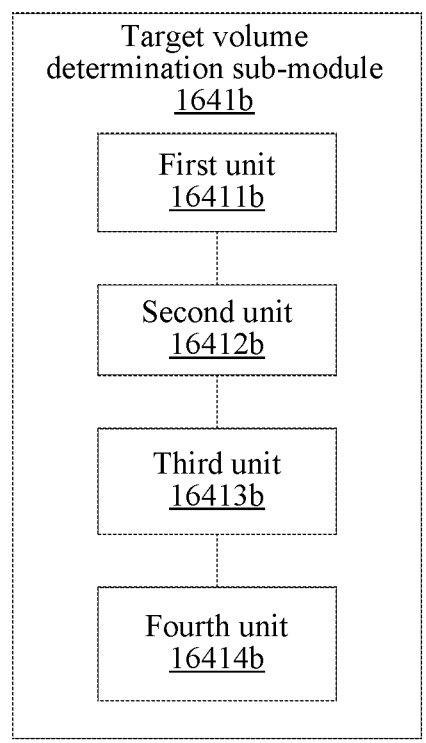
FIG. 22 is an example schematic diagram of a modular structure of a target volume determination sub-module in an implementation of an embodiment of the present application.

Referring to FIG. 22, the target volume determination sub-module 1641b may include:

a first unit 16411b, configured to determine a distance according to the position information;

a second unit 16412b, configured to obtain a first sub-noise intensity value in the noise intensity value according to the distance and the current volume;

a third unit 16413b, configured to obtain a second sub-noise intensity value according to the noise intensity value and the first sub-noise intensity value; and a fourth unit 16414b, configured to determine the target volume according to the predetermined threshold, the first sub-noise intensity value, the second sub-noise intensity value and the current volume.

In an example implementation, the message processing module 1650 is further configured to extract noise sampling information and a corresponding sampling time from the second message.

Figure 23:
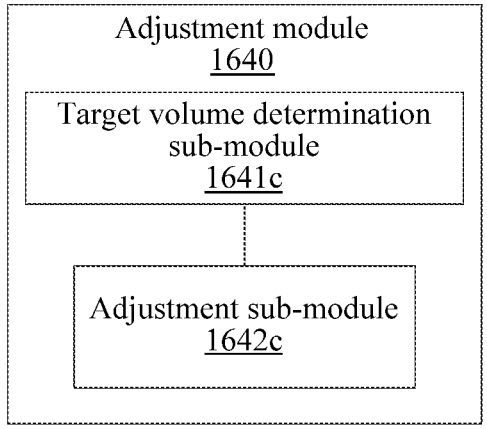
FIG. 23 is an example schematic diagram of a modular structure of an adjustment module in an implementation of an embodiment of the present application.

Referring to FIG. 23, in the example implementation, the adjustment module 1640 includes:

a target volume determination sub-module 1641c, configured to determine a target volume according to the noise intensity value, the predetermined threshold, the current volume, the noise sampling information and the sampling time; and an adjustment sub-module 1642c, configured to adjust the volume according to the target volume.

Figure 24:
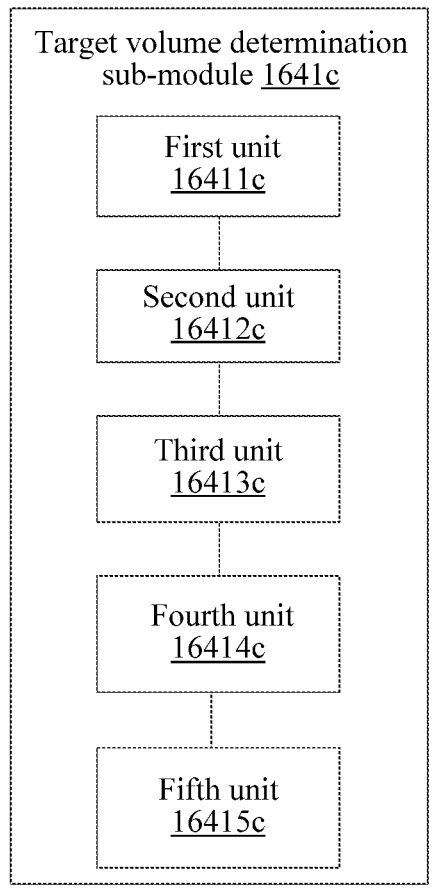
FIG. 24 is an example schematic diagram of a modular structure of a target volume determination sub-module in an implementation of an embodiment of the present application.

Referring to FIG. 24, the target volume determination sub-module 1641c includes:

a first unit 16411c, configured to match the noise sampling information with own sound output record, to determine a sounding time of the noise sampling information;

a second unit 16412*c*, configured to determine a distance between the noise controlled device and the first device according to a time difference between the sampling time and the sounding time;

a third unit 16413*c*, configured to obtain a first sub-noise intensity value at the first device according to the distance and the current volume;

a fourth unit 16414*c*, configured to obtain a second sub-noise intensity value according to the noise intensity value and the first sub-noise intensity value; and a fifth unit 16415*c*, configured to determine the target volume according to the predetermined threshold, the first sub-noise intensity value, the second sub-noise intensity value and the current volume.

Figure 25:
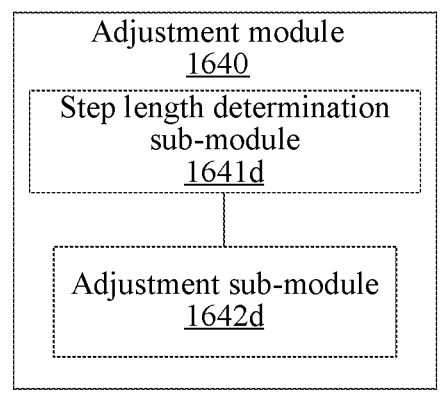
FIG. 25 is an example schematic diagram of a modular structure of an adjustment module in an implementation of an embodiment of the present application.

Referring to FIG. 25, in an example implementation, the adjustment module 1640 includes:

a step length determination sub-module 1641*d*, configured to determine a step length according to the second message and a current volume of the device; and an adjustment sub-module 1642*d*, configured to adjust the volume according to the step length.

Figure 26:
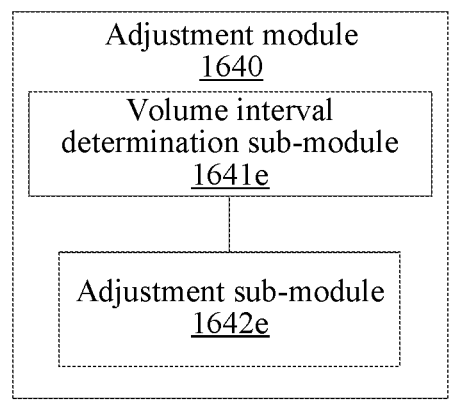
FIG. 26 is an example schematic diagram of a modular structure of an adjustment module in an implementation of an embodiment of the present application.

Referring to FIG. 26, in an example implementation, the adjustment module 1640 includes:

a volume interval determination sub-module 1641*e*, configured to determine a volume interval according to the second message and a current volume of the device; and an adjustment sub-module 1642*e*, configured to control the volume to be within the volume interval.

Figure 27:
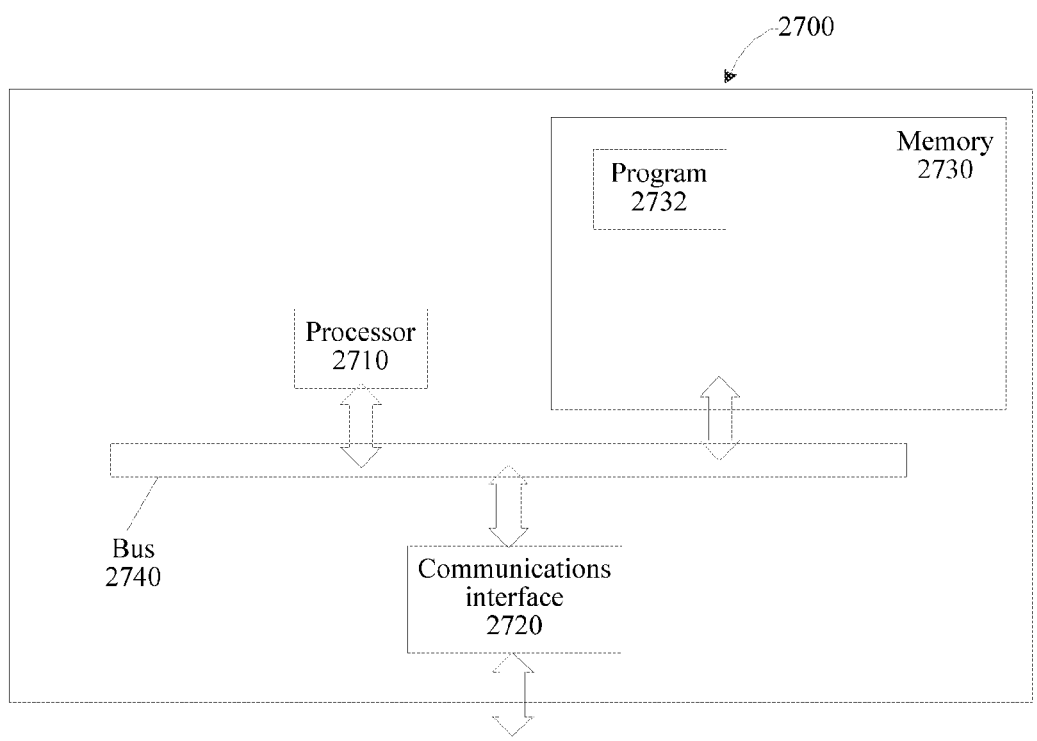
FIG. 27 is an example structural diagram of a noise controlling device according to an embodiment of the present application.

The structure of a noise controlling device according to one embodiment of the present application is shown in FIG. 27. The specific embodiment of the present application does not limit specific implementation of the noise controlling device; referring to FIG. 27, the noise controlling device 2700 may include:

a processor 2710, a communications interface 2720, a memory 2730, and a communications bus 2740.

The processor 2710, the communications interface 2720, and the memory 2730 complete mutual communications via the communications bus 2740.

The communications interface 2620 is configured to communicate with another network element.

The processor 2710 is configured to execute a program 2732, and may specifically implement relevant steps in the process embodiments shown in FIG. 1 to FIG. 12.

Specifically, the program 2732 may include a program code, the program code including a computer operation instruction.

The processor 2710 may be a central processing unit (CPU), or an application specific integrated circuit (ASIC), or be configured to be one or more integrated circuits which implement the embodiments of the present application.

The memory 2730 is configured to store the program 2732. The memory 2730 may include a high-speed RAM memory, and may also include a non-volatile memory, for example, at least one magnetic disk memory. The program 2732 may specifically execute the following steps:

acquiring noise information of an ambient environment;

judging whether the noise information satisfies a predetermined condition, and if yes, acquiring a first message from a first device; and judging, according to the first message, whether the noise information is related to the first device, and if yes, sending a second message to the first device, the second message being used to notify the first device to adjust a volume.

Reference may be made to the corresponding steps or modules in the foregoing embodiments for specific realization of each step in the program 2732, which is not repeated herein. Those skilled in the art may clearly understand that, reference may be made to the corresponding description in the foregoing process embodiments for the particular working procedures of the devices and modules described above, and will not be repeated herein in order to make the description convenient and concise.

Figure 28:
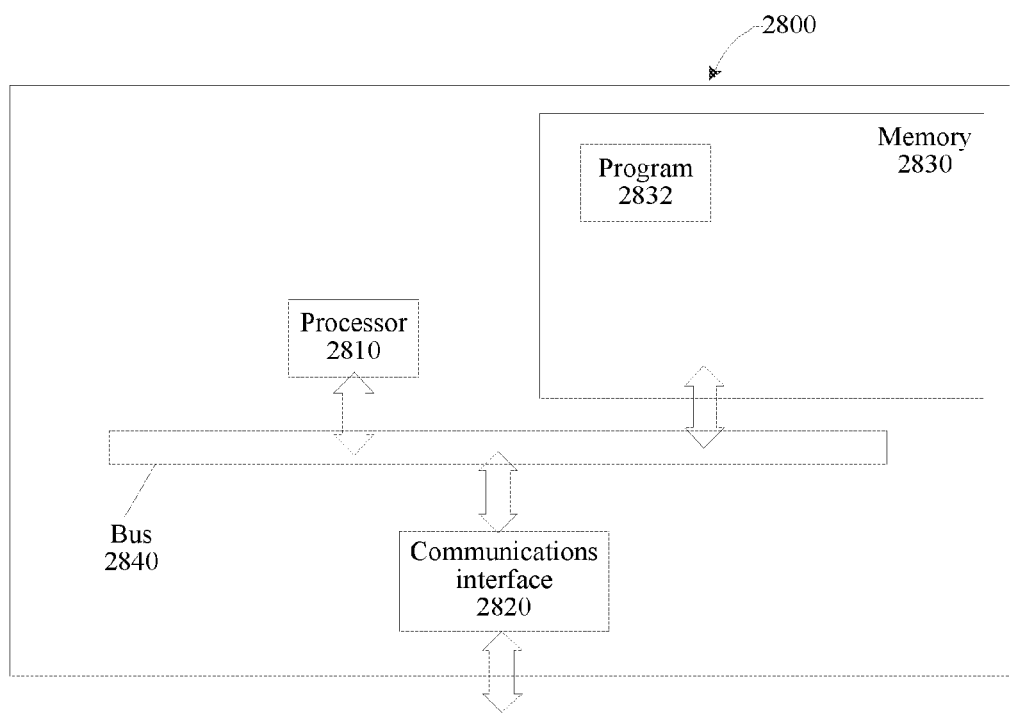
FIG. 28 is an example structural diagram of a noise controlled device according to an embodiment of the present application.

The structure of a noise controlled device according to one embodiment of the present application is as shown in FIG. 28. The specific embodiment of the present application does not limit specific implementation of the noise controlled device; referring to FIG. 28, the noise controlled device 2800 may include:

a processor 2810, a communications interface 2820, a memory 2830, and a communications bus 2840.

The processor 2810, the communications interface 2820, and the memory 2830 complete mutual communications via the communications bus 2840.

The communications interface 2820 is configured to communicate with another network element.

The processor 2810 is configured to execute a program 2832, and may specifically implement relevant steps in the process embodiment shown in FIG. 9.

Specifically, the program 2832 may include a program code, the program code including a computer operation instruction.

The processor 2810 may be a central processing unit (CPU), or an application specific integrated circuit (ASIC), or be configured to be one or more integrated circuits which implement the embodiments of the present application.

The memory 2830 is configured to store the program 2832. The memory 2830 may include a high-speed RAM memory, and may also include a non-volatile memory, for example, at least one magnetic disk memory. The program 2832 may specifically execute the following steps: acquiring, by the device sound sampling information of a sound the device makes;

sending a first message including the sound sampling information;

receiving a second message from an external device; and adjusting a volume based on a volume adjustment policy according to the second message and a current volume.

Reference may be made to the corresponding steps or modules in the foregoing embodiments for specific realization of each step in the program 2832, which is not repeated herein. Those skilled in the art may clearly understand that, reference may be made to the corresponding description in the foregoing process embodiments for the particular working procedures of the devices and modules described above, and will not be repeated herein in order to make the description convenient and concise.

It may be appreciated by those of ordinary skill in the art that each exemplary unit and method step described with reference to the embodiments disclosed herein may be implemented by electronic hardware or a combination of computer software and electronic hardware. Whether these functions are executed in a hardware mode or a software mode depends on particular applications and design constraint conditions of the technical solution. The professional technicians may use different methods to implement the functions described with respect to each particular application, but such implementation should not be considered to go beyond the scope of the present application.

If the functions are implemented in the form of a software functional unit and is sold or used as an independent product, it may be stored in a computer-readable storage medium. Based on such understanding, the technical solution of the present application essentially or the part which contributes to the prior art or a part of the technical solution may be embodied in the form of a software product, and the computer software product is stored in a storage medium, and includes several instructions for enabling a computer device (which may be a personal computer, a controller, a network device, or the like) to execute all or some steps of the method described in each embodiment of the present application. The foregoing storage medium includes various media which may store a program code, such as a USB disk, a mobile hard disk, a read-merely memory (ROM), a random access memory (RAM), a magnetic disk, an optical disc, or the like.

The above embodiments are merely used to describe the present application, instead of limiting the present application; various alterations and variants may be made by those of ordinary skill in the art without departing from the spirit and scope of the present application, so all equivalent technical solutions also belong to the scope of the present application, and the scope of patent protection of the present application should be defined by claims.

What is claimed is:

1. A method, comprising:
   acquiring, by a device comprising a processor, noise information of an ambient environment;
   in response to determining that the noise information satisfies a predetermined condition, acquiring, by the device, a first message from a first device, wherein the first message comprises sound sampling information, and the first device is remote from the device;
   determining, by the device, whether the noise information is related to the first device based on the sound sampling information matching the noise information according to a matching criterion; and
   in response to the noise information being determined to be related to the first device, sending, by the device, a second message to the first device that instructs the first device to adjust a volume.

2. The method of claim 1, wherein the noise information comprises: a noise intensity value.

3. The method of claim 2, wherein the predetermined condition being satisfied comprises the noise intensity value being greater than a predetermined threshold.

4. The method of claim 1, wherein the sound sampling information of the first device comprises: a sound sampling fragment or a sound sampling feature of the first device.

5. The method of claim 2, wherein the second message comprises: the noise intensity value and a predetermined threshold.

6. The method of claim 5, wherein the noise information further comprises: noise sampling information and a corresponding sampling time.

7. The method of claim 6, wherein the second message further comprises: the noise sampling information and the corresponding sampling time.

8. The method of claim 6, wherein the noise sampling information comprises: a noise sampling fragment or a noise sampling feature.

9. The method of claim 5, wherein the second message further comprises: a transmit power value of the second message.

10. The method of claim 5, wherein the second message further comprises: position information.

11. The method of claim 2, wherein the noise intensity value is a noise sound pressure level or a noise signal intensity.

12. The method of claim 1, wherein the noise information comprises first noise information of at least one sound frequency interval.

13. The method of claim 12, further comprising: setting, by the device, the at least one sound frequency interval according to user input.

14. The method of claim 1, wherein the first device is a television device.

15. The method of claim 1, wherein the first device is an audio system.

16. The method of claim 1, wherein the first device is a computer.

17. A device, comprising:
    a memory, coupled to a processor, that stores executable modules, the executable modules comprising:
    a first acquisition module configured to acquire noise information of an ambient environment;
    a first determination module configured to determine whether the noise information satisfies a predetermined condition;
    a second acquisition module configured to acquire a first message from a first device in response to the noise information being determined to satisfy the predetermined condition, wherein the first message comprises sound sampling information, and the first device is remote from the device;
    a second determination module configured to determine, whether the noise information is related to the first device based on a comparison of the noise information to the sound sampling information according to a matching criterion; and
    a message sending module configured to send a second message to the first device in response to the noise information being determined to be related to the first device, wherein the second message controls the first device to adjust a volume.

18. The device of claim 17, wherein the first acquisition module comprises: a first acquisition unit configured to acquire a noise intensity value of the ambient environment.

19. The device of claim 18, wherein the first acquisition module further comprises: a second acquisition unit configured to acquire noise sampling information and a corresponding sampling time from noise of the ambient environment.

20. The device of claim 17, wherein the executable modules further comprise: a setting module, configured to set at least one sound frequency interval according to user input, the noise information being noise information of the at least one sound frequency interval.

21. The device of claim 17, wherein the second determination module is configured to determine whether the sound sampling information matches the noise information, and in response to the sampling information being determined to match the noise information, determine that the noise information is related to the first device.

22. The device of claim 17, wherein the noise information comprises: a noise intensity value.

23. The device of claim 22, wherein the predetermined condition comprises the noise intensity value being greater than a predetermined threshold.

24. The device of claim 23, wherein the second message comprises: the noise intensity value and a predetermined threshold.

25. The device of claim 24, wherein the second message further comprises: a transmit power value of the second message.

26. The device of claim 24, wherein the noise information further comprises: noise sampling information and a corresponding sampling time.

27. The device of claim 26, wherein the second message further comprises: the noise sampling information and the corresponding sampling time.

28. The device of claim 26, wherein the noise sampling information comprises: a noise sampling fragment or a noise sampling feature.

29. The device of claim 24, wherein the second message further comprises: position information.

30. The device of claim 22, wherein the noise intensity value is a noise sound pressure level or a noise signal intensity.

31. The device of claim 17, wherein the noise information comprises first noise information of at least one sound frequency interval.

32. The device of claim 31, further comprising a setting module configured to set the at least one sound frequency interval according to user input.

33. The device of claim 17, wherein the sound sampling information of the first device comprises: a sound sampling fragment or a sound sampling feature of the first device.

34. The device of claim 17, wherein the first device is a television device.

35. The device of claim 17, wherein the first device is an audio system.

36. The device of claim 17, wherein the first device is a computer.

37. A computer readable storage device, comprising at least one executable instruction, which, in response to execution, causes a noise controlling device comprising a processor to perform operations, comprising:
  acquiring noise information of an ambient environment;
  in response to determining that the noise information satisfies a predetermined condition, acquiring a first message from a first device, wherein the first message comprises sound sampling information, and the first device is remote from the noise controlling device;
  determining, by the device, whether the noise information is related to the first device based on the sound sampling information matching the noise information according to a matching criterion; and
  in response to the noise information being determined to be related to the first device, sending a second message to the first device that controls the first device to adjust a volume.

38. The computer readable storage device of claim 37, wherein the noise information comprises: a noise intensity value.

39. The computer readable storage device of claim 38, wherein the noise intensity value is a noise sound pressure level or a noise signal intensity.

40. The computer readable storage device of claim 38, wherein the predetermined condition being satisfied comprises the noise intensity value being greater than a predetermined threshold.

41. The computer readable storage device of claim 38, wherein the second message comprises: the noise intensity value and a predetermined threshold.

42. The computer readable storage device of claim 41, wherein the second message further comprises: a transmit power value of the second message.

43. The computer readable storage device of claim 41, wherein the noise information further comprises: noise sampling information and a corresponding sampling time.

44. The computer readable storage device of claim 43, wherein the second message further comprises: the noise sampling information and the corresponding sampling time.

45. The computer readable storage device of claim 43, wherein the noise sampling information comprises: a noise sampling fragment or a noise sampling feature.

46. The computer readable storage device of claim 41, wherein the second message further comprises: position information.

47. The computer readable storage device of claim 37, wherein the noise information comprises noise information of at least one sound frequency interval.

48. The computer readable storage device of claim 47, the operations further comprising: setting the at least one sound frequency interval according to user input.

49. The computer readable storage device of claim 37, wherein the sound sampling information of the first device comprises: a sound sampling fragment or a sound sampling feature of the first device.

50. A noise controlling device, characterized by comprising a processor and a memory, the memory storing computer executable instructions, the processor being connected to the memory through a communication bus, and when the noise controlling device operates, the processor executes the computer executable instructions stored in the memory, so that the noise controlling device performs operations, comprising:
  acquiring noise information of an ambient environment;
  determining whether the noise information satisfies a predetermined condition, and in response to a determination that the noise information satisfies the predetermined condition, acquiring a first message from a first device, wherein the first message comprises sound sampling information of the first device, and the first device is remote from the noise controlling device; and
  determining, according to the first message, whether the noise information is related to the first device, wherein the determining, according to the first message, whether the noise information is related to the first device comprises:
    determining whether the sound sampling information matches the noise information, and in response to the sound sampling information being determined to match the noise information, determining that the noise information is related to the first device; and
  in response to the determination that the noise information is related to the first device, sending a second message to the first device, wherein the second message being used to notify the first device to adjust a volume.

51. A mobile phone, comprising:
  a memory, coupled to a processor, that stores executable modules, the executable modules comprising:
    a first acquisition module configured to acquire noise information of an ambient environment;
    a first determination module configured to determine whether the noise information satisfies a predetermined condition;
    a second acquisition module configured to acquire a first message from a first device in response to the noise information being determined to satisfy the predetermined condition, wherein the first message comprises sound sampling information, and the first device is remote from the mobile phone;
    a second determination module configured to determine whether the noise information is related to the first device based on a comparison of the noise information to the sound sampling information according to a matching criterion; and a message sending module configured to send a second message to the first device in response to the noise information being determined to be related to the first device, wherein the second message controls the first device to adjust a volume.

52. A smart watch, comprising:

a memory, coupled to a processor, that stores executable modules, the executable modules comprising:

a first acquisition module configured to acquire noise information of an ambient environment;

a first determination module configured to determine whether the noise information satisfies a predetermined condition;

a second acquisition module configured to acquire a first message from a first device in response to the noise information being determined to satisfy the predetermined condition, wherein the first message comprises sound sampling information, and the first device is remote from the smart watch;

a second determination module configured to determine whether the noise information is related to the first device based on a comparison of the noise information to the sound sampling information according to a matching criterion; and a message sending module configured to send a second message to the first device in response to the noise information being determined to be related to the first device, wherein the second message controls the first device to adjust a volume.

53. A smart glasses, comprising:

a memory, coupled to a processor, that stores executable modules, the executable modules comprising:

a first acquisition module configured to acquire noise information of an ambient environment;

a first determination module configured to determine whether the noise information satisfies a predetermined condition;

a second acquisition module configured to acquire a first message from a first device in response to the noise information being determined to satisfy the predetermined condition, wherein the first message comprises sound sampling information, and the first device is remote from the smart glasses;

a second determination module configured to determine whether the noise information is related to the first device based on a comparison of the noise information to the sound sampling information according to a matching criterion; and a message sending module configured to send a second message to the first device in response to the noise information being determined to be related to the first device, wherein the second message controls the first device to adjust a volume.

54. A smart ring, comprising:

a memory, coupled to a processor, that stores executable modules, the executable modules comprising:

a first acquisition module configured to acquire noise information of an ambient environment;

a first determination module configured to determine whether the noise information satisfies a predetermined condition;

a second acquisition module configured to acquire a first message from a first device in response to the noise information being determined to satisfy the predetermined condition, wherein the first message comprises sound sampling information;

a second determination module configured to determine whether the noise information is related to the first device based on a comparison of the noise information to the sound sampling information according to a matching criterion; and a message sending module configured to send a second message to the first device in response to the noise information being determined to be related to the first device, wherein the second message controls the first device to adjust a volume.

\* \* \* \* \*